(12) United States Patent
Rathweg et al.

(10) Patent No.: US 8,430,966 B2
(45) Date of Patent: Apr. 30, 2013

(54) VAPOR DEPOSITION APPARATUS AND PROCESS FOR CONTINUOUS DEPOSITION OF A THIN FILM LAYER ON A SUBSTRATE

(75) Inventors: Christopher Rathweg, Louisville, CO (US); Max William Reed, Niwot, CO (US); Mark Jeffrey Pavol, Arvada, CO (US); Scott Daniel Feldman-Peabody, Golden, CO (US); Russell Weldon Black, Longmont, CO (US)

(73) Assignee: Primestar Solar, Inc., Arvada, CO (US)

( * ) Notice: Subject to any disclaimer, the term of this patent is extended or adjusted under 35 U.S.C. 154(b) by 452 days.

(21) Appl. No.: 12/639,053

(22) Filed: Dec. 16, 2009

(65) Prior Publication Data

US 2011/0143491 A1 Jun. 16, 2011

(51) Int. Cl.
*H01L 21/20* (2006.01)
*H01L 31/18* (2006.01)
*C23C 16/00* (2006.01)

(52) U.S. Cl.
USPC ........... 118/726; 118/718; 118/719; 118/724; 118/729

(58) Field of Classification Search .................. 118/726, 118/727, 718, 719, 724, 729; 156/345.51–54
See application file for complete search history.

(56) References Cited

U.S. PATENT DOCUMENTS

| | | | |
|---|---|---|---|
| 4,478,174 A * | 10/1984 | Ranger | 118/718 |
| 5,248,349 A | 9/1993 | Foote et al. | |
| 5,304,499 A | 4/1994 | Bonnet et al. | |
| 5,366,764 A | 11/1994 | Sunthankar | |
| 5,712,187 A | 1/1998 | Li et al. | |
| 5,994,642 A | 11/1999 | Higuchi et al. | |
| 6,423,565 B1 | 7/2002 | Barth et al. | |
| 6,444,043 B1 | 9/2002 | Gegenwart et al. | |
| 6,719,848 B2 | 4/2004 | Faykosh et al. | |
| 7,194,197 B1 | 3/2007 | Wendt et al. | |
| 2002/0117199 A1 | 8/2002 | Oswald | |
| 2003/0044539 A1 | 3/2003 | Oswald | |
| 2005/0016461 A1* | 1/2005 | Klug et al. | 118/726 |
| 2005/0158891 A1* | 7/2005 | Barth et al. | 438/22 |
| 2006/0219177 A1* | 10/2006 | Brcka | 118/726 |
| 2009/0148598 A1* | 6/2009 | Zolla et al. | 427/251 |
| 2009/0194165 A1 | 8/2009 | Murphy et al. | |

FOREIGN PATENT DOCUMENTS

EP 0853345 A1 7/1998

* cited by examiner

*Primary Examiner* — Parviz Hassanzadeh
*Assistant Examiner* — Nathan K Ford
(74) *Attorney, Agent, or Firm* — Dority & Manning, P.A.

(57) ABSTRACT

An apparatus and related process are provided for vapor deposition of a sublimated source material as a thin film on a photovoltaic (PV) module substrate. A receptacle is disposed within a vacuum head chamber and is configured for receipt of a source material. A heated distribution manifold is disposed below the receptacle and includes a plurality of passages defined therethrough. The receptacle is indirectly heated by the distribution manifold to a degree sufficient to sublimate source material within the receptacle. A distribution plate is disposed below the distribution manifold and at a defined distance above a horizontal plane of a substrate conveyed through the apparatus. The distribution plate includes a pattern of holes therethrough that further distribute the sublimated source material passing through the distribution manifold onto the upper surface of the underlying substrate.

10 Claims, 4 Drawing Sheets

FIG. -1-

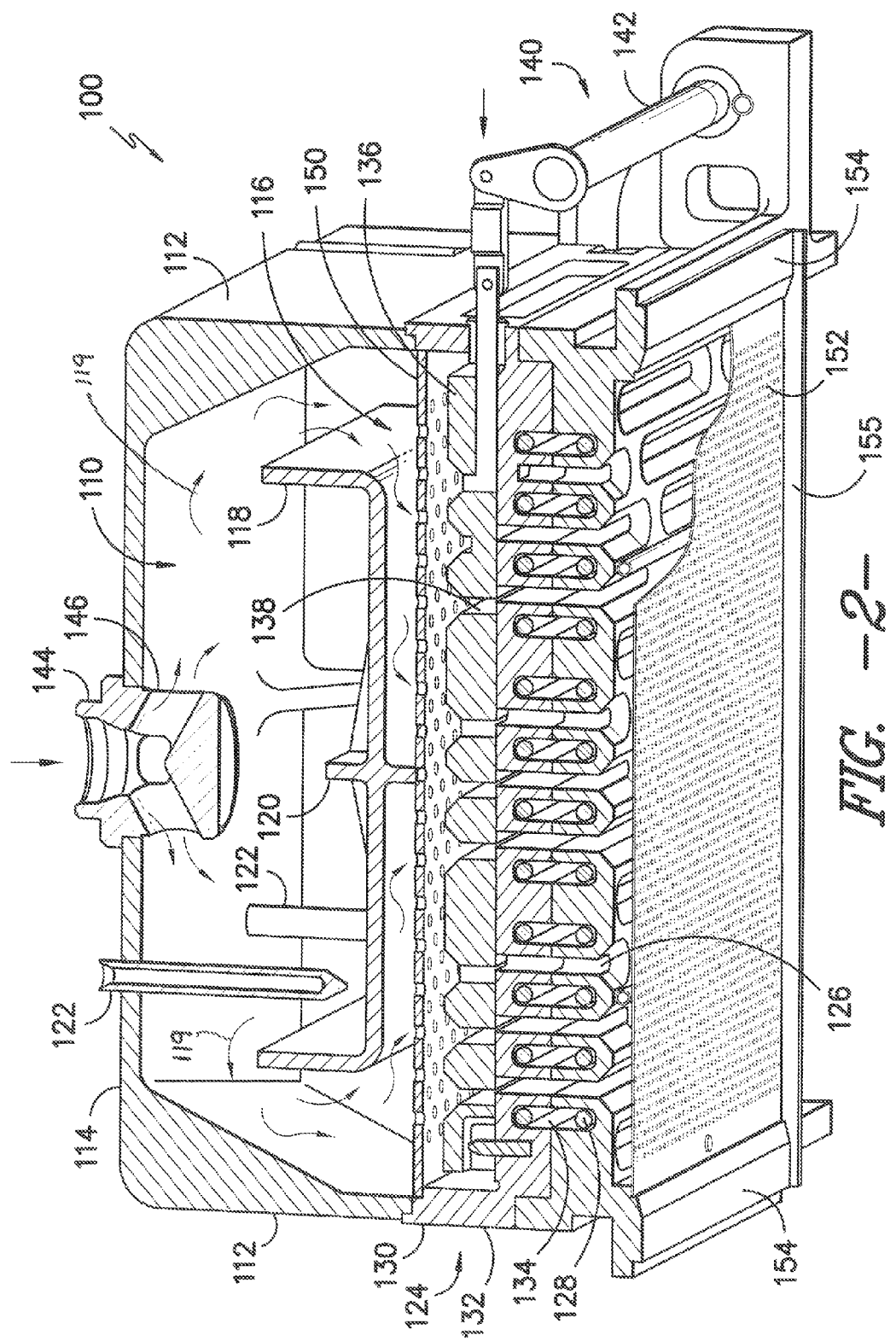

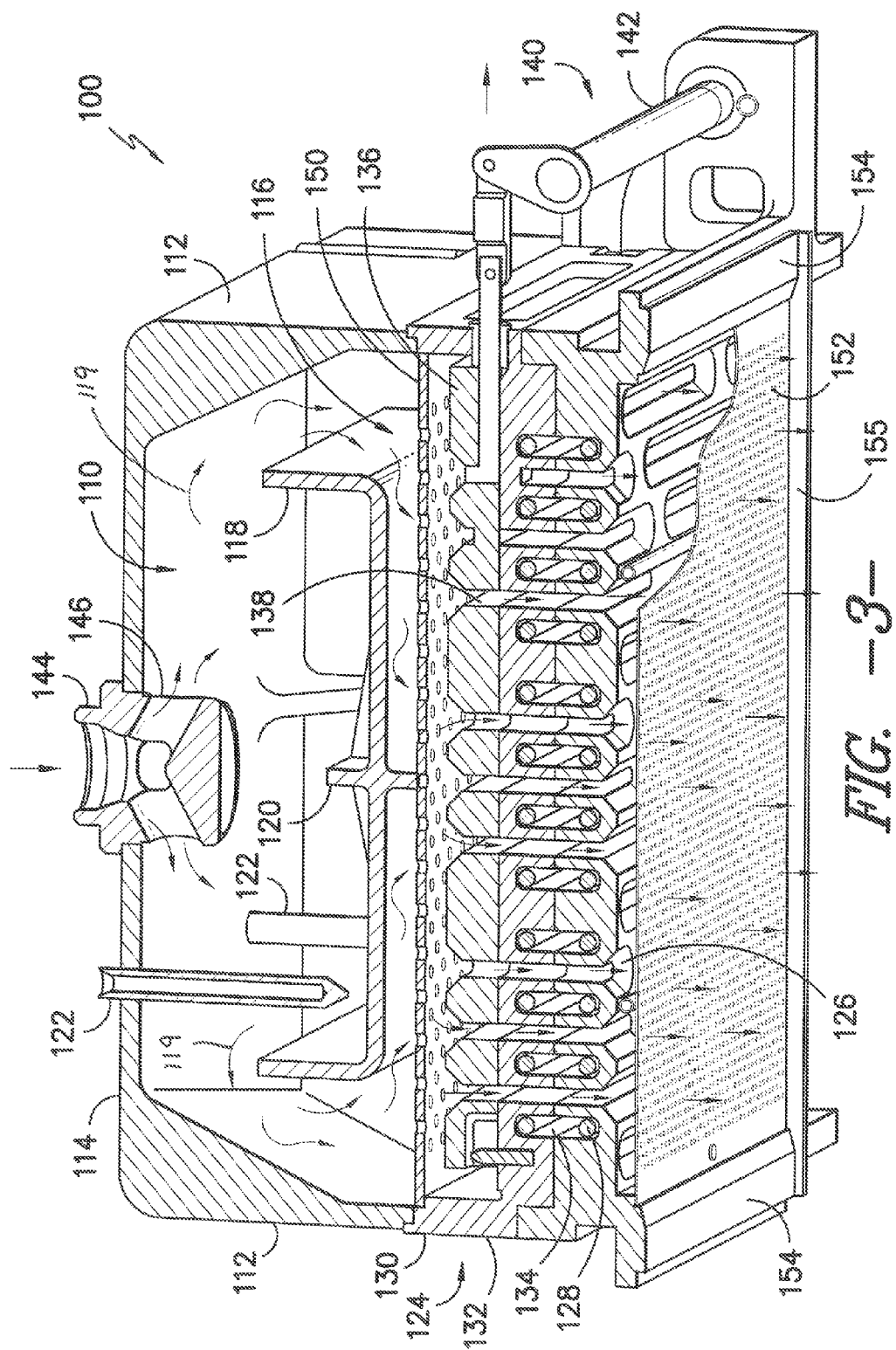
FIG. -3-

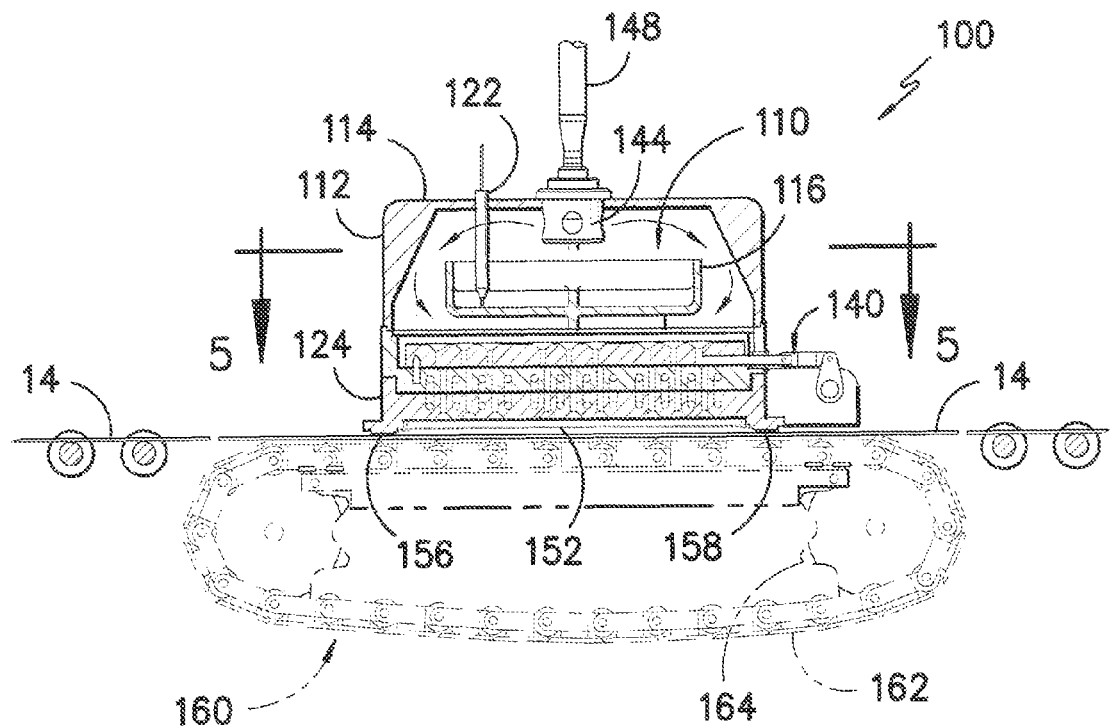
FIG. -4-
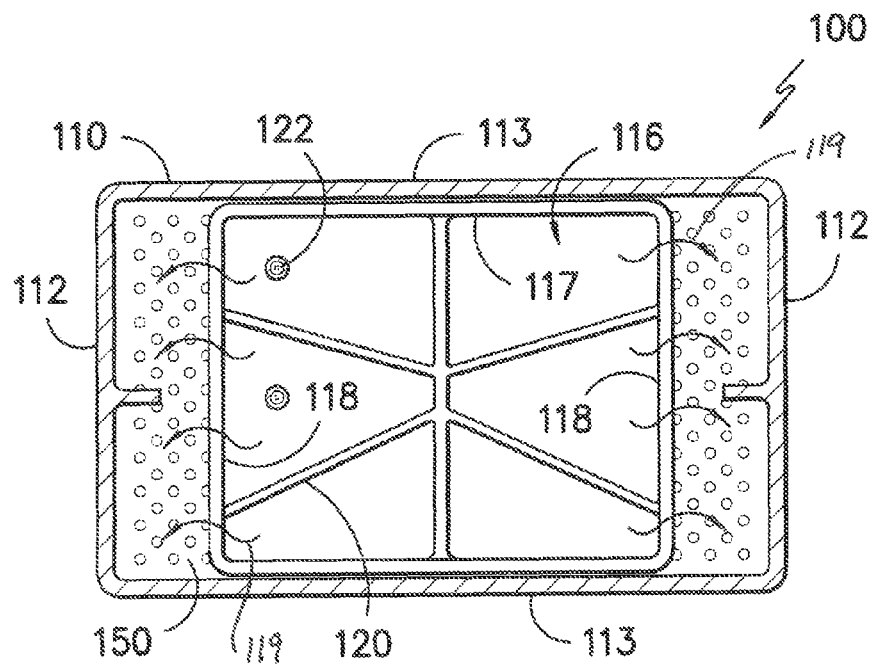
FIG. -5-

VAPOR DEPOSITION APPARATUS AND PROCESS FOR CONTINUOUS DEPOSITION OF A THIN FILM LAYER ON A SUBSTRATE

FIELD OF THE INVENTION

The subject matter disclosed herein relates generally to the field of thin film deposition processes wherein a thin film layer, such as a semiconductor material layer, is deposited on a substrate. More particularly, the subject matter is related to a vapor deposition apparatus and associated process for depositing a thin film layer of a photo-reactive material on a glass substrate in the formation of photovoltaic (PV) modules.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy (sunlight) to electricity. For example, CdTe has an energy bandgap of 1.45 eV, which enables it to convert more energy from the solar spectrum (sunlight) as compared to lower bandgap (1.1 eV) semiconductor materials historically used in solar cell applications. Also, CdTe converts light more efficiently in lower or diffuse light conditions as compared to the lower bandgap materials and, thus, has a longer effective conversion time over the course of a day or in low-light (i.e., cloudy) conditions as compared to other conventional materials.

Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner.

Certain factors greatly affect the efficiency of CdTe PV modules in terms of cost and power generation capacity. For example, CdTe is relatively expensive and, thus, efficient utilization (i.e., minimal waste) of the material is a primary cost factor. In addition, the energy conversion efficiency of the module is a factor of certain characteristics of the deposited CdTe film layer. Non-uniformity or defects in the film layer can significantly decrease the output of the module, thereby adding to the cost per unit of power. Also, the ability to process relatively large substrates on an economically sensible commercial scale is a crucial consideration.

CSS (Close Space Sublimation) is a known commercial vapor deposition process for production of CdTe modules. Reference is made, for example, to U.S. Pat. No. 6,444,043 and U.S. Pat. No. 6,423,565. Within the vapor deposition chamber in a CSS system, the substrate is brought to an opposed position at a relatively small distance (i.e., about 2-3 mm) opposite to a CdTe source. The CdTe material sublimes and deposits onto the surface of the substrate. In the CSS system of U.S. Pat. No. 6,444,043 cited above, the CdTe material is in granular form and is held in a heated receptacle within the vapor deposition chamber. The sublimated material moves through holes in a cover placed over the receptacle and deposits onto the stationary glass surface, which is held at the smallest possible distance (1-2 mm) above the cover frame. The cover is heated to a temperature greater than the receptacle.

While there are advantages to the CSS process, the related system is inherently a batch process wherein the glass substrate is indexed into a vapor deposition chamber, held in the chamber for a finite period of time in which the film layer is formed, and subsequently indexed out of the chamber. The system is more suited for batch processing of relatively small surface area substrates. The process must be periodically interrupted in order to replenish the CdTe source, which is detrimental to a large scale production process. In addition, the deposition process cannot readily be stopped and restarted in a controlled manner, resulting in significant non-utilization (i.e., waste) of the CdTe material during the indexing of the substrates into and out of the chamber, and during any steps needed to position the substrate within the chamber.

Accordingly, there exists an ongoing need in the industry for an improved vapor deposition apparatus and process for economically feasible large scale production of efficient PV modules, particularly CdTe modules.

BRIEF DESCRIPTION OF THE INVENTION

Aspects and advantages of the invention will be set forth in part in the following description, or may be obvious from the description, or may be learned through practice of the invention.

In accordance with an embodiment of the invention, an apparatus is provided for vapor deposition of a sublimated source material, such as CdTe, as a thin film on a photovoltaic (PV) module substrate. Although the invention is not limited to any particular film thickness, a "thin" film layer is generally recognized in the art as less than 10 microns (µm). The apparatus includes a deposition head, and a receptacle disposed in the deposition head. The receptacle is configured for receipt of a source material, such as a granular CdTe material. A heated distribution manifold is disposed below the receptacle and includes a plurality of passages defined therethrough. The receptacle is indirectly heated by the distribution manifold to a temperature effective for sublimating the source material within the receptacle. The sublimated source material flows out of the receptacle and downward in the head chamber through the passages in the distribution manifold. In a particular embodiment, a distribution plate is disposed below the distribution manifold and is at a defined distance above a horizontal plane of an upper surface of a substrate conveyed through the apparatus. The distribution plate includes a pattern of holes therethrough that further distribute the sublimated source material such that the material is deposited as a thin film having a substantially uniform desired thickness on the upper surface of the substrates. The substrates may be continuously conveyed at a constant (i.e., non-stop) linear conveyance rate through the apparatus.

In yet another embodiment, an apparatus for vapor deposition of a sublimated source material as a thin film on a photovoltaic (PV) module substrate includes a deposition head, and a receptacle disposed in an upper section of the deposition head for receipt of a granular source material, such as CdTe. A heated distribution manifold is disposed below the receptacle and includes a plurality of passages defined therethrough. The receptacle is indirectly heated by the distribution manifold to a degree sufficient to sublimate the source material within the receptacle. In a particular embodiment, the receptacle includes transversely extending end walls that are spaced from the walls of the deposition head a distance such that the sublimated source material flows primarily out and over the end walls of the receptacle and downwardly as transverse leading and trailing curtains towards and through the distribution manifold. The curtains of sublimated source material may be further distributed in the transverse and, to some extent, in the longitudinal directions before being deposited onto the upper surface of substrates conveyed through the apparatus. The substrates may be conveyed at a constant linear conveyance rate through the apparatus.

Variations and modifications to the embodiments of the vapor deposition apparatus discussed above are within the scope and spirit of the invention and may be further described herein.

In still another aspect, the invention encompasses a process for vapor deposition of a sublimated source material, such as CdTe, as a thin film on a photovoltaic (PV) module substrate. The process includes supplying source material to a receptacle within a deposition head, and indirectly heating the receptacle with a heat source member disposed below the receptacle to sublimate the source material. The sublimated source material is directed downwardly within the deposition head through the heat source. Individual substrates are conveyed below the heat source, and the sublimated source material that passes through the heat source is deposited onto an upper surface of the substrates such that leading and trailing sections of the substrates in a direction of conveyance are exposed to the same vapor deposition conditions in the head chamber to achieve a substantially uniform thickness of the thin film layer on the upper surface of the substrates. The substrates may be conveyed at a constant linear rate through the apparatus, with the sublimated source material being directed from the receptacle primarily as transversely extending leading and trailing curtains relative to the conveyance direction of the substrates. The curtains of sublimated source material may be further distributed transversely and, to some extent, longitudinally relative to the conveyance direction of the substrates after passing through the heat source member by, for example, being directed through a distribution plate disposed below the heat source member.

Variations and modifications to the embodiment of the vapor deposition process discussed above are within the scope and spirit of the invention and may be further described herein.

These and other features, aspects, and advantages of the present invention will become better understood with reference to the following description and appended claims, or may be obvious from the description or claims, or may be learned through practice of the invention.

BRIEF DESCRIPTION OF THE DRAWING

A full and enabling disclosure of the present invention, including the best mode thereof, is set forth in the specification, which makes reference to the appended drawings, in which:

FIG. 1 is a plan view of a system that may incorporate embodiments of a vapor deposition apparatus of the present invention;

FIG. 2 is a cross-sectional view of an embodiment of a vapor deposition apparatus according to aspects of the invention in a first operational configuration;

FIG. 3 is a cross-sectional view of the embodiment of FIG. 2 in a second operational configuration;

FIG. 4 is a cross-sectional view of the embodiment of FIG. 2 in cooperation with a substrate conveyor; and, FIG. 5 is a top view of the receptacle component within the embodiment of FIG. 2

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

Figure 1:
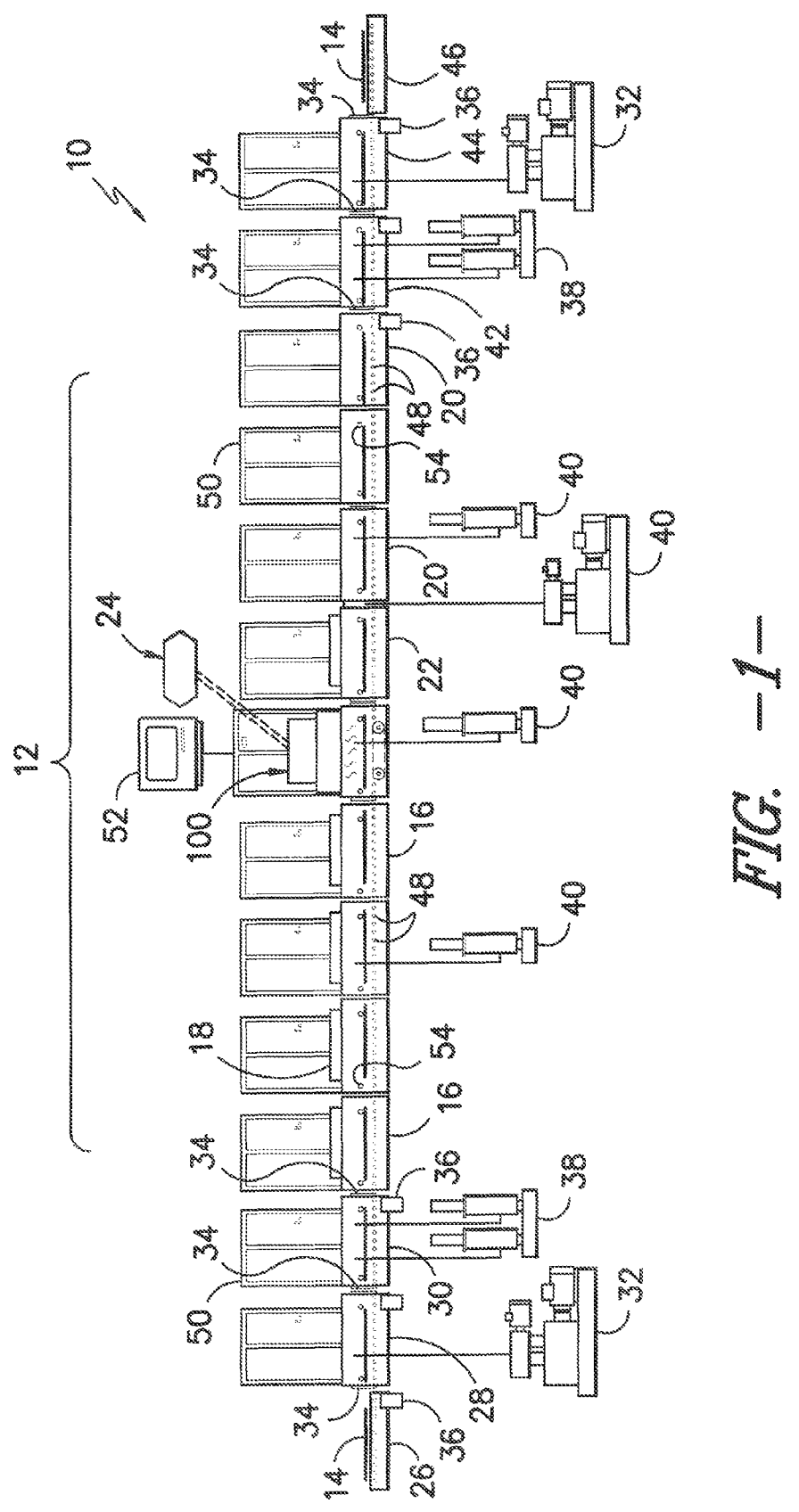

FIG. 1 illustrates an embodiment of a system 10 that may incorporate a vapor deposition apparatus 100 (FIGS. 2 through 5) in accordance with embodiments of the invention configured for deposition of a thin film layer on a photovoltaic (PV) module substrate 14 (referred to hereafter as a "substrate"). The thin film may be, for example, a film layer of cadmium telluride (CdTe). As mentioned, it is generally recognized in the art that a "thin" film layer on a PV module substrate is generally less than about 10 microns ($\mu$m). It should be appreciated that the present vapor deposition apparatus 100 is not limited to use in the system 10 illustrated in FIG. 1, but may be incorporated into any suitable processing line configured for vapor deposition of a thin film layer onto a PV module substrate 14.

For reference and an understanding of an environment in which the vapor deposition apparatus 100 may be used, the system 10 of FIG. 1 is described below, followed by a detailed description of the apparatus 100.

Referring to FIG. 1, the exemplary system 10 includes a vacuum chamber 12 defined by a plurality of interconnected modules. Any combination of rough and fine vacuum pumps 40 may be configured with the modules to draw and maintain a vacuum within the chamber 12. The vacuum chamber 12 includes a plurality of heater modules 16 that define a pre-heat section of the vacuum chamber through which the substrates 14 are conveyed and heated to a desired temperature before being conveyed into the vapor deposition apparatus 100. Each of the modules 16 may include a plurality of independently controlled heaters 18, with the heaters defining a plurality of different heat zones. A particular heat zone may include more than one heater 18.

The vacuum chamber 12 also includes a plurality of interconnected cool-down modules 20 downstream of the vapor deposition apparatus 100. The cool-down modules 20 define a cool-down section within the vacuum chamber 12 through which the substrates 14 having the thin film of sublimated source material deposited thereon are conveyed and cooled at a controlled cool-down rate prior to the substrates 14 being removed from the system 10. Each of the modules 20 may include a forced cooling system wherein a cooling medium, such as chilled water, refrigerant, gas, or other medium, is pumped through cooling coils (not illustrated) configured with the modules 20.

In the illustrated embodiment of system 10, at least one post-heat module 22 is located immediately downstream of the vapor deposition apparatus 100 and upstream of the cool-down modules 20 in a conveyance direction of the substrates. The post-heat module 22 maintains a controlled heating profile of the substrate 14 until the entire substrate is moved out of the vapor deposition apparatus 100 to prevent damage to the substrate, such as warping or breaking caused by uncontrolled or drastic thermal stresses. If the leading section of the substrate 14 were allowed to cool at an excessive rate as it exited the apparatus 100, a potentially damaging temperature gradient would be generated longitudinally along the substrate 14. This condition could result in breaking, cracking, or warping of the substrate from thermal stress.

As diagrammatically illustrated in FIG. 1, a feed device 24 is configured with the vapor deposition apparatus 100 to supply source material, such as granular CdTe. The feed device 24 may take on various configurations within the scope and spirit of the invention, and functions to supply the source material without interrupting the continuous vapor deposition process within the apparatus 100 or conveyance of the substrates 14 through the apparatus 100.

Still referring to FIG. 1, the individual substrates 14 are initially placed onto a load conveyor 26, and are subsequently moved into an entry vacuum lock station that includes a load module 28 and a buffer module 30. A "rough" (i.e., initial) vacuum pump 32 is configured with the load module 28 to drawn an initial vacuum, and a "fine" (i.e., final) vacuum pump 38 is configured with the buffer module 30 to increase the vacuum in the buffer module 30 to essentially the vacuum pressure within the vacuum chamber 12. Valves 34 (e.g., gate-type slit valves or rotary-type flapper valves) are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 into the vacuum chamber 12 in a step-wise manner without affecting the vacuum within the chamber 12.

In operation of the system 10, an operational vacuum is maintained in the vacuum chamber 12 by way of any combination of rough and/or fine vacuum pumps 40. In order to introduce a substrate 14 into the vacuum chamber 12, the load module 28 and buffer module 30 are initially vented (with the valve 34 between the two modules in the open position). The valve 34 between the buffer module 30 and the first heater module 16 is closed. The valve 34 between the load module 28 and load conveyor 26 is opened and a substrate 14 is moved into the load module 28. At this point, the first valve 34 is shut and the rough vacuum pump 32 then draws an initial vacuum in the load module 28 and buffer module 30. The substrate 14 is then conveyed into the buffer module 30, and the valve 34 between the load module 28 and buffer module 30 is closed. The fine vacuum pump 38 then increases the vacuum in the buffer module 30 to approximately the same vacuum in the vacuum chamber 12. At this point, the valve 34 between the buffer module 30 and vacuum chamber 12 is opened and the substrate 14 is conveyed into the first heater module 16.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and valves 34 are sequentially operated to move the substrates 14 out of the vacuum chamber 12 in a step-wise fashion without loss of vacuum condition within the vacuum chamber 12.

System 10 also includes a conveyor system configured to move the substrates 14 into, through, and out of the vacuum chamber 12. In the illustrated embodiment, this conveyor system includes a plurality of individually controlled conveyors 48, with each of the various modules including a respective one of the conveyors 48. It should be appreciated that the type or configuration of the conveyors 48 may vary. In the illustrated embodiment, the conveyors 48 are roller conveyors having rotatably driven rollers that are controlled so as to achieve a desired conveyance rate of the substrates 14 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as diagrammatically illustrated in FIG. 1. The central system controller 52 can monitor and control (via the independent controllers 50) the functions of any one of the modules so as to achieve an overall desired heat-up rate, deposition rate, cool-down rate, conveyance rate, and so forth, in processing of the substrates 14 through the system 10.

Referring to FIG. 1, for independent control of the individual respective conveyors 48, each of the modules may include any manner of active or passive sensors 54 that detects the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired conveyance rate through the vacuum chamber 12.

FIGS. 2 through 5 relate to a particular embodiment of the vapor deposition apparatus 100. Referring to FIGS. 2 and 3 in particular, the apparatus 100 includes a deposition head 110 defining an interior space in which a receptacle 116 is configured for receipt of a granular source material (not shown). As mentioned, the granular source material may be supplied by a feed device or system 24 (FIG. 1) via a feed tube 148 (FIG. 4). The feed tube 148 is connected to a distributor 144 disposed in an opening in a top wall 114 of the deposition head 110. The distributor 144 includes a plurality of discharge ports 146 that are configured to evenly distribute the granular source material into the receptacle 116. The receptacle 116 has an open top and may include any configuration of internal ribs 120 or other structural elements.

In the illustrated embodiment, at least one thermocouple 122 is operationally disposed through the top wall 114 of the deposition head 110 to monitor temperature within the deposition head 110 adjacent to or in the receptacle 116.

The deposition head 110 also includes longitudinal end walls 112 and side walls 113 (FIG. 5). Referring to FIG. 5 in particular, the receptacle 116 has a shape and configuration such that the transversely extending end walls 118 of the receptacle 116 are spaced from the end walls 112 of the head chamber 110. The longitudinally extending side walls 117 of the receptacle 116 lie adjacent to and in close approximation to the side walls 113 of the deposition head so that very little clearance exists between the respective walls, as depicted in FIG. 5. With this configuration, sublimated source material will flow out of the open top of the receptacle 116 and downwardly over the transverse end walls 118 as leading and trailing curtains of vapor 119 over, as depicted by the flow lines in FIGS. 2, 3, and 5. Very little of the sublimated source material will flow over the side walls 117 of the receptacle 116. The curtains of vapor 119 are "transversely" oriented in that they extend across the transverse dimension of the deposition head 110, which is generally perpendicular to the conveyance direction of the substrates through the system.

A heated distribution manifold 124 is disposed below the receptacle 116. This distribution manifold 124 may take on various configurations within the scope and spirit of the invention, and serves to indirectly heat the receptacle 116, as well as to distribute the sublimated source material that flows from the receptacle 116. In the illustrated embodiment, the heated distribution manifold 124 has a clam-shell configuration that includes an upper shell member 130 and a lower shell member 132. Each of the shell members 130, 132 includes recesses therein that define cavities 134 when the shell members are mated together as depicted in FIGS. 2 and 3. Heater elements 128 are disposed within the cavities 134 and serve to heat the distribution manifold 124 to a degree sufficient for indirectly heating the source material within the receptacle 116 to cause sublimation of the source material. The heater elements 128 may be made of a material that reacts with the source material vapor and, in this regard, the shell members 130, 132 also serve to isolate the heater elements 128 from contact with the source material vapor. The heat generated by the distribution manifold 124 is also sufficient to prevent the sublimated source material from plating out onto components of the head chamber 110. Desirably, the coolest component in the head chamber 110 is the upper surface of the substrates 14 conveyed therethrough so as to ensure that the sublimated source material plates onto the substrate, and not onto components of the head chamber 110.

Still referring to FIGS. 2 and 3, the heated distribution manifold 124 includes a plurality of passages 126 defined therethrough. These passages have a shape and configuration so as to uniformly distribute the sublimated source material towards the underlying substrates 14 (FIG. 4).

In the illustrated embodiment, a distribution plate 152 is disposed below the distribution manifold 124 at a defined distance above a horizontal plane of the upper surface of an underlying substrate 14, as depicted in FIG. 4. This distance may be, for example, between about 0.3 cm to about 4.0 cm. In a particular embodiment, the distance is about 1.0 cm. The conveyance rate of the substrates below the distribution plate 152 may be in the range of, for example, about 10 mm/sec to about 40 mm/sec. In a particular embodiment, this rate may be, for example, about 20 mm/sec. The thickness of the CdTe film layer that plates onto the upper surface of the substrate 14 can vary within the scope and spirit of the invention, and may be, for example, between about 1 micron to about 5 microns. In a particular embodiment, the film thickness may be about 3 microns.

The distribution plate 152 includes a pattern of passages, such as holes, slits, and the like, therethrough that further distribute the sublimated source material passing through the distribution manifold 124 such that the source material vapors are uninterrupted in the transverse direction. In other words, the pattern of passages are shaped and staggered or otherwise positioned to ensure that the sublimated source material is deposited completely over the substrate in the transverse direction so that longitudinal streaks or stripes of "un-coated" regions on the substrate are avoided.

As previously mentioned, a significant portion of the sublimated source material will flow out of the receptacle 116 as leading and trailing curtains of vapor, as depicted in FIG. 5. Although these curtains of vapor will diffuse to some extent in the longitudinal direction prior to passing through the distribution plate 152, it should be appreciated that it is unlikely that a uniform distribution of the sublimated source material in the longitudinal direction will be achieved. In other words, more of the sublimated source material will be distributed through the longitudinal end sections of the distribution plate 152 as compared to the middle portion of the distribution plate. However, as discussed above, because the system 10 conveys the substrates 14 through the vapor deposition apparatus 100 at a constant (non-stop) linear speed, the upper surfaces of the substrates 14 will be exposed to the same deposition environment regardless of any non-uniformity of the vapor distribution along the longitudinal aspect of the apparatus 100. The passages 126 in the distribution manifold 124 and the holes in the distribution plate 152 ensure a relatively uniform distribution of the sublimated source material in the transverse aspect of the vapor deposition apparatus 100. So long as the uniform transverse aspect of the vapor is maintained, a relatively uniform thin film layer is deposited onto the upper surface of the substrates 14 regardless of any non-uniformity in the vapor deposition along the longitudinal aspect of the apparatus 100.

As illustrated in the figures, it may be desired to include a debris shield 150 between the receptacle 116 and the distribution manifold 124. This shield 150 includes holes defined therethrough (which may be larger or smaller than the size of the holes of the distribution plate 152) and primarily serves to retain any granular or particulate source material from passing through and potentially interfering with operation of the movable components of the distribution manifold 124, as discussed in greater detail below. In other words, the debris shield 150 can be configured to act as a breathable screen that inhibits the passage of particles without substantially interfering with vapors flowing through the shield 150.

Referring to FIGS. 2 through 4 in particular, apparatus 100 desirably includes transversely extending seals 154 at each longitudinal end of the head chamber 110. In the illustrated embodiment, the seals define an entry slot 156 and an exit slot 158 at the longitudinal ends of the head chamber 110. These seals 154 are disposed at a distance above the upper surface of the substrates 14 that is less than the distance between the surface of the substrates 14 and the distribution plate 152, as is depicted in FIG. 4. The seals 154 help to maintain the sublimated source material in the deposition area above the substrates. In other words, the seals 154 prevent the sublimated source material from "leaking out" through the longitudinal ends of the apparatus 100. It should be appreciated that the seals 154 may be defined by any suitable structure. In the illustrated embodiment, the seals 154 are actually defined by components of the lower shell member 132 of the heated distribution manifold 124. It should also be appreciated that the seals 154 may cooperate with other structure of the vapor deposition apparatus 100 to provide the sealing function. For example, the seals may engage against structure of the underlying conveyor assembly in the deposition area.

Any manner of longitudinally extending seal structure 155 may also be configured with the apparatus 100 to provide a seal along the longitudinal sides thereof. Referring to FIGS. 2 and 3, this seal structure 155 may include a longitudinally extending side member that is disposed generally as close as reasonably possible to the upper surface of the underlying convey surface so as to inhibit outward flow of the sublimated source material without frictionally engaging against the conveyor.

Referring to FIGS. 2 and 3, the illustrated embodiment includes a movable shutter plate 136 disposed above the distribution manifold 124. This shutter plate 136 includes a plurality of passages 138 defined therethrough that align with the passages 126 in the distribution manifold 124 in a first operational position of the shutter plate 136 as depicted in FIG. 3. As can be readily appreciated from FIG. 3, in this operational position of the shutter plate 136, the sublimated source material is free to flow through the shutter plate 136 and through the passages 126 in the distribution manifold 124 for subsequent distribution through the plate 152. Referring to FIG. 2, the shutter plate 136 is movable to a second operational position relative to the upper surface of the distribution manifold 124 wherein the passages 138 in the shutter plate 136 are misaligned with the passages 126 in the distribution manifold 124. In this configuration, the sublimated source material is blocked from passing through the distribution manifold 124, and is essentially contained within the interior volume of the head chamber 110. Any suitable actuation mechanism, generally 140, may be configured for moving the shutter plate 136 between the first and second operational positions. In the illustrated embodiment, the actuation mechanism 140 includes a rod 142 and any manner of suitable linkage that connects the rod 142 to the shutter plate 136. The rod 142 is rotated by any manner of mechanism located externally of the head chamber 110.

The shutter plate 136 configuration illustrated in FIGS. 2 and 3 is particularly beneficial in that, for whatever reason, the sublimated source material can be quickly and easily contained within the head chamber 110 and prevented from passing through to the deposition area above the conveying unit. This may be desired, for example, during start up of the system 10 while the concentration of vapors within the head chamber builds to a sufficient degree to start the deposition process. Likewise, during shutdown of the system, it may be desired to maintain the sublimated source material within the head chamber 110 to prevent the material from condensing on the conveyor or other components of the apparatus 100.

Referring to FIG. 4, the vapor deposition apparatus 100 may further comprise a conveyor 160 disposed below the head chamber 110. This conveyor 160 may be uniquely configured for the deposition process as compared to the conveyors 48 discussed above with respect to the system 10 of FIG. 1. For example, the conveyor 160 may be a self-contained conveying unit that includes a continuous loop conveyor on which the substrates 14 are supported below the distribution plate 152. In the illustrated embodiment, the conveyor 160 is defined by a plurality of slats 162 that provide a flat, unbroken (i.e., no gaps between the slats) support surface for the substrates 14. The slat conveyor is driven in an endless loop around sprockets 164. It should be appreciated, however, that the invention is not limited to any particular type of conveyor 160 for moving the substrates 14 through the vapor deposition apparatus 100.

The present invention also encompasses various process embodiments for vapor deposition of a sublimated source material to foi a thin film on a PV module substrate. The various processes may be practiced with the system embodiments described above or by any other configuration of suitable system components. It should thus be appreciated that the process embodiments according to the invention are not limited to the system configuration described herein.

In a particular embodiment, the vapor deposition process includes supplying source material to a receptacle within a deposition head, and indirectly heating the receptacle with a heat source member to sublimate the source material. The sublimated source material is directed out of the receptacle and downwardly within the deposition head through the heat source member. Individual substrates are conveyed below the heat source member. The sublimated source material that passes through the heat source is distributed onto an upper surface of the substrates such that leading and trailing sections of the substrates in the direction of conveyance thereof are exposed to the same vapor deposition conditions so as to achieve a desired uniform thickness of the thin film layer on the upper surface of the substrates.

In a unique process embodiment, the sublimated source material is directed from the receptacle primarily as transversely extending leading and trailing curtains relative to the conveyance direction of the substrates. The curtains of sublimated source material are directed downwardly through the heat source member towards the upper surface of the substrates. These leading and trailing curtains of sublimated source material may be longitudinally distributed to some extent relative to the conveyance direction of the substrates after passing through the heat source member.

In yet another unique process embodiment, the passages for the sublimated source material through the heat source may be blocked with an externally actuated blocking mechanism, as discussed above.

Desirably, the process embodiments include continuously conveying the substrates at a constant linear speed during the vapor deposition process.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An apparatus for vapor deposition of a sublimated source material as a thin film on a photovoltaic (PV) module substrate, said apparatus comprising:
   a deposition head;
   a receptacle disposed in said deposition head, said receptacle configured for receipt of a granular source material;
   a heated distribution manifold disposed below said receptacle, said distribution manifold comprising a plurality of passages defined therethrough, said receptacle indirectly heated by said distribution manifold to a degree sufficient to sublimate source material within said receptacle, wherein said distribution manifold comprises internal heating elements arranged between said passages in said manifold;
   a distribution plate disposed below said distribution manifold and at a defined distance above a horizontal conveyance plane of an upper surface of a substrate conveyed through said apparatus, said distribution plate comprising a pattern of passages therethrough that further distribute the sublimated source material passing through said distribution manifold; and
   a conveyor system positioned below the distribution plate and configured to convey the substrate through said apparatus.

2. The apparatus as in claim 1, wherein said receptacle comprises transversely extending end walls and longitudinally extending side walls, said end walls spaced from said deposition head a distance such that the sublimated source material flows primarily as transversely extending leading and trailing curtains of vapor over said end walls and downwardly through said distribution manifold.

3. The apparatus as in claim 2, wherein said passages in said distribution plate are in a pattern such that flow of the sublimated source material from said distribution manifold is uninterrupted across said distribution plate transverse to a conveyance direction of the substrate through said apparatus.

4. The apparatus as in claim 1, further comprising a transversely extending seal at each longitudinal end of said deposition head, said seals defining an entry and exit slot for a substrate conveyed through said apparatus, said seals disposed at a distance above the surface of the substrate that is less than the distance between the surface of the substrate and said distribution plate.

5. The apparatus as in claim 1, further comprising a movable shutter plate disposed above said distribution manifold, said shutter plate comprising a plurality of passages therethrough that align with said passages in said distribution manifold in a first position of said shutter plate to allow passage of sublimated source material through said distribution manifold, said shutter plate movable to a second position wherein said shutter plate blocks said passages in said distribution manifold to flow of sublimated material therethrough.

6. The apparatus as in claim 5, further comprising an actuation mechanism connected to said shutter plate to move said shutter plate between said first and second positions.

7. The apparatus as in claim 1, wherein said distribution manifold comprises an upper shell member and a lower shell member, said shell members defining internal cavities in which said heating elements are disposed.

8. The apparatus as in claim 1, further comprising a distributor configured in a top wall of said deposition head to disperse the source material around said receptacle.

9. The apparatus as in claim 1, further comprising a debris shield disposed between said distribution manifold and said receptacle.

10. The apparatus as in claim 1, wherein the conveyor system comprises a conveyor disposed below said deposition head, said conveyor unit comprising a continuous loop conveyor on which the substrates are supported below said distribution plate, said conveyor configured to convey the substrates at a constant linear speed through said apparatus between an entry slot and an exit slot such that leading and trailing sections of the substrates are exposed to generally the same vapor deposition conditions within said deposition head in a direction of conveyance of the substrates through said apparatus.

* * * * *